United States Patent [19]

Donley

[11] 4,370,669
[45] Jan. 25, 1983

[54] REDUCED SOURCE CAPACITANCE RING-SHAPED IGFET LOAD TRANSISTOR IN MESA-TYPE INTEGRATED CIRCUIT

[75] Inventor: William B. Donley, Kokomo, Ind.

[73] Assignee: General Motors Corporation, Detroit, Mich.

[21] Appl. No.: 169,527

[22] Filed: Jul. 16, 1980

[51] Int. Cl.³ .............................................. H01L 29/78
[52] U.S. Cl. .................................... 357/23; 357/51; 357/56; 357/59
[58] Field of Search ................. 357/23 R, 23 VD, 56, 357/51, 59

[56] References Cited

U.S. PATENT DOCUMENTS

| | | | |
|---|---|---|---|
| 3,102,230 | 8/1963 | Kahng | 323/94 |
| 3,208,002 | 9/1965 | MacDonald | 330/38 |
| 3,344,322 | 9/1967 | Dill | 357/23 VD |
| 3,475,234 | 10/1969 | Kerwin et al. | 148/187 |
| 3,751,722 | 8/1973 | Richman | 317/235 R |
| 3,786,319 | 1/1974 | Tomisaburo | 357/23 R |
| 3,823,352 | 7/1974 | Pruniaux et al. | 357/56 |
| 3,853,633 | 10/1974 | Armstrong | 148/1.5 |
| 4,070,690 | 1/1978 | Wickstrom | 357/56 |
| 4,196,443 | 4/1980 | Dingwall | 357/68 |
| 4,217,599 | 8/1980 | Sato et al. | 357/56 |
| 4,228,447 | 10/1980 | Sato et al. | 357/56 |
| 4,229,756 | 10/1980 | Sato et al. | 357/56 |
| 4,243,997 | 1/1981 | Natori et al. | 357/56 |
| 4,271,423 | 6/1981 | Kang | 357/23 VD |

OTHER PUBLICATIONS

"Rom Program Process May Beat Eproms in Turnaround Time," Electronics, May 25, 1978, pp. 39-40.
A. Dingwall et al., "C²L, A New H-S H-D Buck Cmos Tech.," IEEE J. S-S Ckts., vol. SC-12 #4, Aug. 1977, pp. 344-349.

Primary Examiner—Joseph E. Clawson, Jr.
Attorney, Agent, or Firm—Robert J. Wallace

[57] ABSTRACT

A self-aligned polysilicon gate depletion-type n-channel IGFET serving as a load transistor in a mesa-type integrated circuit having a P+ field region surface. The gate is ring-shaped and surrounds the IGFET source region. The source region does not intersect a mesa edge. The gate overlaps mesa edges to reduce peripheral capacitance.

3 Claims, 5 Drawing Figures

REDUCED SOURCE CAPACITANCE RING-SHAPED IGFET LOAD TRANSISTOR IN MESA-TYPE INTEGRATED CIRCUIT

This invention relates to a load transistor for a switching gate in an insulated gate field effect transistor (IGFET) type of integrated circuit. It more particularly relates to an improved geometry IGFET having an electrically shorted source and gate for use as a load device in an n-channel mesa-type integrated circuit. The improved geometry is ring shaped. It offers higher gain and reduced capacitance over prior IGFETs used in this application. Ring-shaped gates on switching IGFETs have previously been used in CMOS integrated circuits. However, in this invention, I propose to use a ring-shaped IGFET in a particular way as a load transistor in an n-channel mesa-type integrated circuit having a P+ layer underlying its field oxide.

It is, therefore, an object of this invention to provide an improved IGFET-type load transistor for an n-channel mesa-type integrated circuit having a P+ region underlying its field oxide.

The invention includes a self-aligned polysilicon gate depletion-type-n-channel IGFET having an electrically shorted source and gate. The IGFET is formed at one end of an elongated P type silicon mesa that is surrounded by P+ type silicon having a thick silicon dioxide covering layer. A polysilicon ring covers one end of the mesa and serves as a self-aligned gate electrode. It leaves a portion of the mesa exposed within the ring to serve as the IGFET source region. The ring and source region are electrically shorted and an adjacent uncovered mesa portion outside the ring serves as the IGFET drain region.

Other objects, features and advantages of this invention will become more apparent from the following description of the preferred examples thereof and from the drawing, in which.

Figure 1:
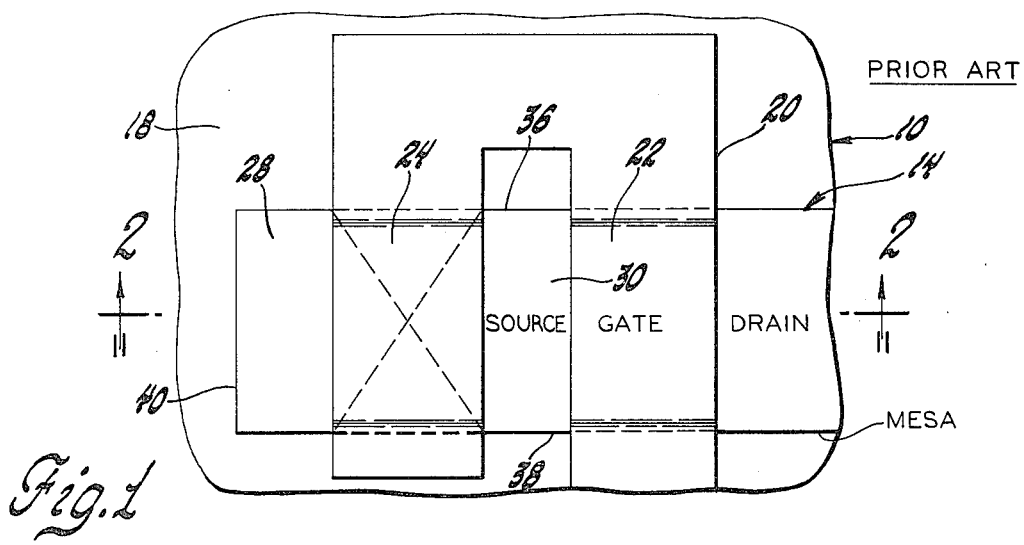
FIG. 1 shows a fragmentary plan view of a prior art IGFET load resistor in an n-channel mesa-type integrated circuit.
Figure 2:
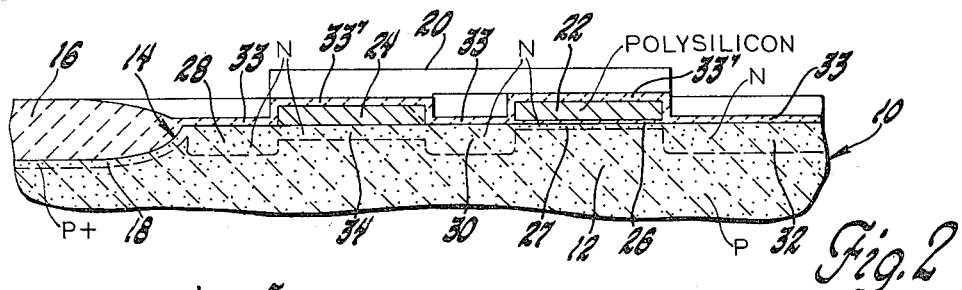
FIG. 2 shows a sectional view along the line 2—2 of FIG. 1.

A prior art IGFET load resistor from an inverter in a mesa-type n-channel integrated circuit is shown in FIGS. 1 and 2. The prior art structure includes a monocrystalline silicon wafer 10 having a fairly high resistivity epitaxial P type surface layer 12. Only a very small surface portion of an integrated circuit region of wafer 10 is shown in FIGS. 1 and 2. Formed on top of the surface layer 12 is an elongated P type mesa 14. Mesa 14 is surrounded by a thick layer 16 of thermally grown silicon dioxide. Silicon dioxide layer 16 provides a field oxide surrounding semiconductive devices formed on mesa 14 and other mesas formed on surface layer 12.

Immediately below field oxide 16 is a P+ region 18 for preventing inversion of the P type silicon at its interface with field oxide layer 16. Mesa 14, thick oxide 16 and P+ region 18 can be formed in the same manner as disclosed in U.S. Pat. No. 3,853,633 Armstrong.

A strip 20 of polycrystalline silicon, hereinafter referred to as polysilicon, crosses mesa 14 at 22 and then loops back to cross mesa 14 again at 24. The portion 22 of polysilicon strip 20 serves as a gate electrode. It is spaced from its underlying mesa surface by a thin layer 26 of thermally grown silicon dioxide, which serves as an IGFET gate oxide. Underlying gate oxide 26 is a shallow N type layer 27 that communicates with N type regions 30 and 32 on opposite sides of polysilicon strip portion. Layer 27 can be formed by ion implantation before IGFET source and drain regions are formed. N type layer 27 provides a channel for a depletion-type IGFET. Portion 24 of polysilicon strip 20 is directly in contact with the surface of mesa 14. That surface has a shallow N-type region 34 that provides low resistance electrical communication with polysilicon strip portion 24.

Regions 28, 30, 32 and 34 of the mesa surface are N type island-like regions, each are produced by diffusion or the like. They are considerably deeper than region 27 and extent entirely across the width of mesa 14. Region 30 serves as a source region for an IGFET. Region 32 is the drain region for that IGFET, and polysilicon strip portion 22 is the gate electrode for the IGFET. Region 34 provides a buried contact between gate portion 24 and source region 30. The polysilicon strip 20 can be delineated and the diffusion regions 28, 30 and 32 formed in accordance with techniques described in U.S. Pat. No. 3,475,234 Kerwin et al. In a Kerwin et al type of process, the polysilicon strip serves as an etch mask to expose regions 28, 30 and 32 for diffusion. Then the polysilicon strip 20 is doped at the same time regions 28, 30 and 32 are diffused. This makes polysilicon strip 20 conductive, so that it can then also serve as a gate electrode, already aligned, for the resulting IGFET. During diffusion, a silicon dioxide coating 33 reforms over regions 28, 30 and 32. Concurrently, a silicon dioxide coating 33' grows on the upper surface and edges of polysilicon strip 20.

The rate of diffusion through polysilicon strip 20 is considerably faster than through the adjacent monocrystalline silicon mesa portions 28, 30 and 32. Accordingly, while regions 28, 30 and 32 are being formed, the diffusant that forms them penetrates portion 24 of polysilicon strip 20. It enters the underlying mesa portion to form the shallower N type region 34. Region 34 is in low resistance electrical communication with source region 30 and polysilicon strip portion 22. Since strip 20 is conductive, this provides an electrical short, or shunt, between source region 30 and the polysilicon gate electrode 24. I refer to this type of interconnection as a buried contact. Because of it, source region 20 needs no separate electrical connection. Drain region 32 extends out of the field of view to an adjacent area of the integrated circuit region, where it contacts an overlying conductor (not shown) of aluminum, polysilicon or the like. The overlying conductor is, in turn, electrically in low resistance electrical communication with a positive voltage supply and is the most positive supply point for the integrated circuit. Another polysilicon strip (also not shown) crosses mesa 14 near but not contiguous drain 32, or crosses an adjacent mesa, to form a cooperating adjacent switching IGFET. The latter can be formed in the usual manner at the same time and by the same processes as described for the IGFET shown in FIGS. 1 and 2. The gate on the latter would normally contact an input or gate line. The latter's source would contact a negative voltage source, such as the most negative supply point for the integrated circuit. The drain region of the latter IGFET would be in low resistance electrical communication with polysilicon strip 20, as by means of a buried contact or oxide window contact with an extension of strip 20. Also, another conductor strip could provide the contact, and the latter's drain could even be region 28 in FIGS. 1 and 2, if region 28 were longer. Oxide coating 33 and 33' is considered transparent, and is not shown in FIG. 1 to better illustrate the underlying surface regions and contours. Analogously, to better focus on the invention an overlying reflowed phosphorous glass coating, normally used on devices of this type, is not shown in FIGS. 1 and 2.

The depletion-type IGFET contemplated in FIGS. 1 and 2, forms the load device for an inverter in which the source region potential for the load device follows the output signal of a serially connected, i.e. cooperating, switching IGFET. Source potential on the load device, therefore, varies between a high and low value each time the switching device it supports is triggered. The P type and P+ type silicon remains at substantially constant voltage. This generates a capacitance at the PN junction between them and the source region. However, I have recognized that the capacitance effect attributable to the P+ type silicon 18 abutting mesa edges 36, 38 and 40 for the device is the largest. It produces a significant peripheral capacitance at mesa edges 36, 38 and 40. Bulk capacitance and gate capacitance are insignificant compared to this peripheral capacitance.

Figure 3:
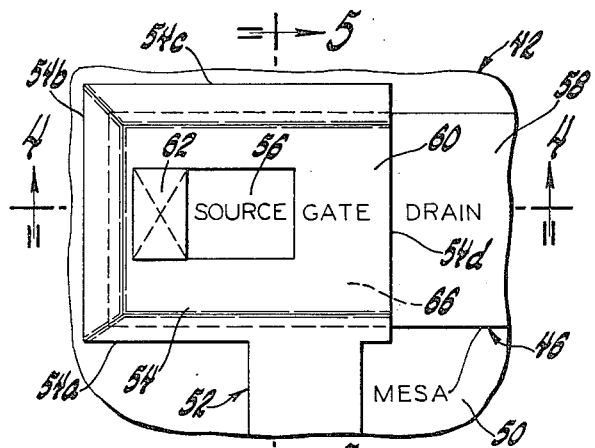
FIG. 3 shows a fragmentary plan view of my improved IGFET load device in an n-channel mesa-type integrated circuit.
Figure 4:
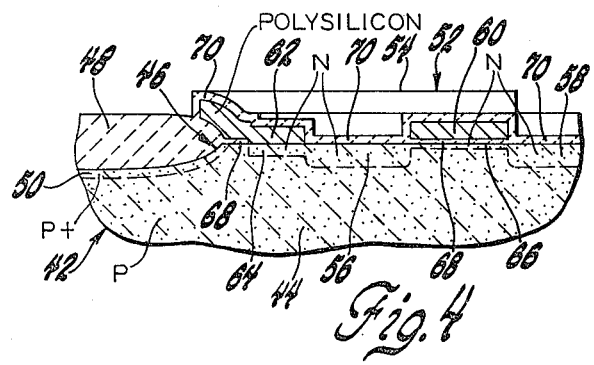
FIG. 4 shows a sectional view along the line 4—4 of FIG. 3.
Figure 5:
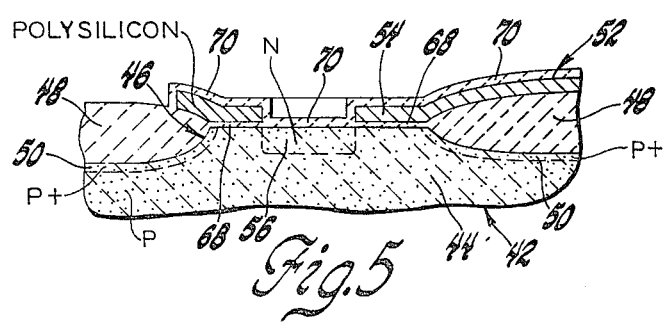
FIG. 5 shows a sectional view along the line 5—5 of FIG. 3.

Reference is now made to FIGS. 3, 4 and 5 which illustrate my improved IGFET load device. My improved load device can be used in the same mesa-type of n-channel integrated circuit such as hereinbefore described. In this connection, the integrated circuit is but one portion of a monocrystalline silicon wafer 42, only a very small part of which is shown in the drawing. Wafer 42 has a fairly high resistance P type region 44 adjacent its upper surface, and an elongated mesa 46 on that surface. Only one end of mesa 46 is shown.

Mesa 46 is surrounded by a thick silicon dioxide layer 48, which covers a P+ type silicon surface region 50. Silicon dioxide layer 48 provides a thick field oxide layer surrounding the mesa 46. A polycrystalline silicon strip 52 on oxide layer 48 extends onto the mesa 46, where it completely covers one end of mesa 46 and loops back to form a closed ring 54. Ring 54 encircles a mesa portion 56. Portion 56 is an interior portion of mesa 46. It does not include any edge of the mesa 46. Mesa portion 56 serves as an IGFET source region. Polysilicon ring 54 is substantially square and thus has four sides 54a, 54b, 54c and 54d, as can be seen. Ring 54 completely covers one end of mesa 46, except for the encircled source region 56. In completely covering one end of the mesa 46, ring 54 overlaps onto the surrounding field oxide 48. For example, ring sides 54a, 54b and 54c are entirely on the surrounding field oxide 48, and do not intersect a mesa edge. The remaining side 54d of the ring 54 crosses mesa 46, and leaves region 58 not covered with polysilicon.

Ring 54 serves as an IGFET gate electrode. Region 58 serves as the drain region for that IGFET. Portion 60 of gate electrode ring 54, between source region 56 and drain region 58, covers channel region 66 between source 56 and drain 58 in the resulting IGFET.

As with polycrystalline strip 22 in FIGS. 1 and 2, polycrystalline ring 54 in FIGS. 3–5 has a portion 62 directly in contact with the underlying surface of mesa 46. A comparatively shallow N type region 64 beneath ring portion 62 provides low resistance electrical communication between ring portion 62 and source region 56. It thus forms a buried contact, or shunt, between source region 56 and gate electrode ring 54. My improved IGFET load device is made by the same techniques as hereinbefore described for making the prior art device shown in FIGS. 1 and 2. Accordingly, the aforementioned buried contact is produced in the same manner as is described in connection with FIGS. 1 and 2. Polysilicon coating 52 is delineated and doped to N type conductivity by the same techniques as used for polysilicon strip 20 in FIGS. 1 and 2. Analogously, the N type regions 56 and 58 would be diffused in the same way as source and drain regions 30 and 32 in FIGS. 1 and 2. My device is thus made by a self-aligning silicon gate-type of process, which makes it convenient to manufacture. No process changes are required. Also analogous to FIGS. 1 and 2, my improved configuration load transistor has its source-gate connection, i.e. polysilicon strip 52 in low resistance electrical connection with the drain of its cooperating adjacent switching transistor and an output terminal out of the field of view. Such connections are not shown since they are not material to this invention. The drain of my improved load device is in low resistance electrical communication (not shown) with a positive voltage supply, such as the most positive supply point for the integrated circuit. This too is similar to the prior art device of FIGS. 1 and 2.

The cooperating switching IGFET is formed in an adjacent portion of mesa 46 noncontiguous drain 58 or on an adjacent second mesa. It can be produced, as with FIGS. 1 and 2, by a polysilicon strip (not shown) crossing the mesa and using the strip as a self-aligned gate for diffusing source and drain regions. The drain can be electrically connected to strip 52 in any convenient way, as already described in connection with FIGS. 1 and 2.

In most instances, I prefer that my improved load device be a depletion-type IGFET rather than an enhancement-type IGFET. For this reason, a shallow N type region 66 is provided under portion 60 of gate ring 54. This communicates source region 56 and drain region 58, and forms a depletion-type IGFET channel, analogous to channel region 27 in FIGS. 1 and 2. Channel 66 provides a path of predetermined resistance, such as about 10 Kohms under gate electrode portion 60. This high resistance can be provided by selective ion implantation through a window in an overlying layer of photoresist before the source and drain regions are diffused. Also analogous to FIGS. 1 and 2, gate ring 54 has a 1000 angstrom thick silicon dioxide coating 68 beneath it, except where buried contact 62 is located. All of polysilicon strip 52 and source and drain regions 56 and 58 are covered with a 2000 angstrom or more thick silicon dioxide coating 70. Oxide coating 68 is not shown in FIG. 3 for convenience in showing underlying regions and contours associated with this invention. Analogously, no reflowed glass overlayer is shown, although it is normally used in such circuits.

In my improved device, bulk capacitance remains the same as in the prior art device of FIGS. 1 and 2. Gate capacitance increases almost a full order of magnitude. This increase in capacitance is obviously undesirable. However, there is an even larger peripheral capacitance in the prior art device. In my device, the peripheral capacitance is entirely eliminated. This results in a net capacitance that is almost one-third lower than the prior art device while maintaining the same gain.

In the event one elects to use this invention in an IGFET load device of the enhancement type, channel region 66 would not be of opposite conductivity type. On the other hand, one may still want to adjust threshold voltage by means of an ion implantation. In such event, the ion implantation could be carried out in the same way as hereinbefore described. However, it would be done with a considerably lesser dosage.

The embodiments of the invention in which an exclusive property or privilege is claimed are defined as follows:

1. In a self-aligned polysilicon gate depletion-type n-channel IGFET having an electrically shorted source region and gate, a drain region coupled with a source of constant potential, having said source region coupled with a source of time varying potential, and formed on a P type silicon mesa that is surrounded by P+ type silicon under a thick silicon dioxide field layer, the improvement comprising means for reducing transistor source capacitance in response to said time varying potential coupled with said source region, the improvement including the polysilicon gate being a ring, the ring wholly encloses a portion of the mesa spaced inwardly from said P+ type silicon, and the enclosed mesa portion serves as the IGFET source region, and no portion of the IGFET source region intersects the P+ type silicon and IGFET capacitance attributable thereto upon variations in source potential is eliminated.

2. In a self-aligned polysilicon gate depletion-type n-channel IGFET having an electrically shorted source region and gate, a drain region coupled with a source of constant potential, having said source region coupled with a source of time varying potential, and formed on a P type silicon mesa that is surrounded by P+ type silicon under a thick silicon dioxide field layer, the improvement comprising means for reducing transistor source capacitance in response to said time varying potential coupled with said source region, the improvement including the mesa being an elongated upper surface, the polysilicon gate being a ring on that surface, the ring wholly encloses a portion of the mesa surface spaced inwardly from said P+ type silicon, the enclosed mesa surface portion serves as the IGFET source region, the gate ring otherwise completely covers one end of the elongated mesa surface, uncovered mesa surface portions contiguous the gate ring serve as a drain region for the IGFET, and the gate ring is electrically shorted to the source region in an area opposite from the drain region, whereby IGFET capacitance is decreased.

3. In a self-aligned polysilicon gate depletion-type n-channel IGFET having an electrically shorted source region and gate, a drain region coupled with a source of constant potential, having said source region coupled with a source of time varying potential, and formed on the surface of a strip-like P type silicon mesa that is surrounded by P+ type silicon under a thick silicon dioxide field layer, the improvement comprising means for reducing transistor source capacitance in response to said time varying potential coupled with said source region, the improvement including the polysilicon gate being a rectangular ring, the ring wholly encloses a rectangular N type interior surface portion of the mesa, the enclosed mesa portion serves as the IGFET source region, the ring otherwise completely covers the mesa surface on three of four sides of the rectangular source region and overlaps onto the surrounding thick oxide adjacent those sides, portions of the mesa contiguous the ring on the fourth source side serves as an N type drain region for the IGFET, and a portion of the ring on the side opposite from the drain region contacting an underlying N type region that, in turn, contacts the N type source region, whereby peripheral capacitance attributable to intersection of said source region with said surrounding P+ type silicon upon variations in source potential is eliminated.

* * * * *